United States Patent

[11] 3,620,631

[72] Inventors Benjamin F. Stopka
Fairport, N.Y.;
Dennis J. Day, Cedar Rapids; James V. Harmon, Cedar Rapids; Robert G. Holt, Cedar Rapids, Iowa

[21] Appl. No. 853,022
[22] Filed Aug. 26, 1969
[45] Patented Nov. 16, 1971
[73] Assignee Collins Radio Company
Cedar Rapids, Iowa

[54] GAIN-CONTROLLED AMPLIFIER

6 Claims, 4 Drawing Figs.

[52] U.S. Cl. .......... 325/404, 325/415, 325/319
[51] Int. Cl. .......... H04b 1/16
[50] Field of Search .......... 325/319, 400, 404, 414, 415, 408; 330/141

[56] References Cited

UNITED STATES PATENTS

| | | | |
|---|---|---|---|
| 3,110,864 | 11/1963 | Smith-Vaniz et al. ........ | 325/319 |
| 2,799,735 | 7/1957 | Breckman et al. ............ | 330/141 |
| 2,735,002 | 2/1956 | Keizer et al. .................. | 325/400 |

OTHER REFERENCES

Instruction Manual- Drake R-4 Receiver, Published By R. L. Drake Co., Miamisburg, Ohio, Revised 1965.

*Primary Examiner*—Robert L. Griffin
*Assistant Examiner*—Anthony H. Handal
*Attorneys*—Henry K. Woodward and Robert J. Crawford

ABSTRACT: Disclosed is a gain-controlled amplifier having a gain control loop including amplifying and filtering means for providing a control signal to the gain-controlled amplifier. The gain control loop further includes crowbar means for providing a maximum gain signal in response to a drop in input signal to the gain-controlled amplifier and fast attack means for providing minimum gain signal in response to a sudden increase in input signal to the gain-controlled amplifier.

INVENTORS.
BENJAMIN F. STOPKA
JAMES V. HARMON
DENNIS J. DAY
ROBERT G. HOLT
BY H. K. Woodward
ATTORNEY INVENTORS.
BENJAMIN F. STOPKA
JAMES V. HARMON
DENNIS J. DAY
ROBERT G. HOLT
BY H. K. Woodward
ATTORNEY INVENTORS.
BENJAMIN F. STOPKA
JAMES V. HARMON
DENNIS J. DAY
ROBERT G. HOLT
BY H. K. Woodward
ATTORNEY

GAIN-CONTROLLED AMPLIFIER

This invention relates to radio receivers generally, and in particular to gain-controlled amplifiers employed in radio receivers.

It is conventional practice to provide gain-controlled amplifiers in radio receivers in order to effectively receive signals having diverse strengths as well as provide stability and minimize distortion. Maximum amplification may be provided for very weak signals, minimum amplification may be provided for strong signals, and controlled amplification may be provided for signals of intermediate strength.

In order to minimize the adverse effects of harmonic and intermodulation distortion, considerable filtering must be provided in the automatic gain control loop for the gain-controlled amplifier. In an IF amplifier, for example, low-pass RC filters are employed which attenuate audiofrequencies that accompany a signal with envelope modulation. However, this filtering tends to limit the response time of the automatic gain control loop because of the charging and discharging time of the capacitive elements. For example, a radio having an IF amplifier designed to receive a signal varying from 10 microvolt RMS to 4 volts peak (the two signals being over 100 db. apart) could conceivably encounter a delay of one second or more in adjusting the gain controlled IF amplifier from the larger signal to the smaller signal, and vice versa.

Accordingly, an object of this invention is a radio receiver employing gain controlled amplifiers having fast response to changing levels of input signals.

Another object of the invention is a gain controlled amplifier with a gain control loop including means for providing maximum gain in response to a drop of a predetermined amount in amplifier input voltage.

Still another object of the invention is a gain controlled amplifier with a gain control loop including means for providing minimum gain in response to the application of an input signal of maximum intensity.

Another object of the invention is a gain controlled amplifier with a gain control loop having improved filtering.

Yet another object of the invention is a radio receiver having a fast attack capability which may be readily designed to satisfy a wide range of speed requirements.

These and other objects and features of the invention will be apparent from the following description and drawings.

Briefly, a radio receiver is provided with a gain-controlled amplifier having a gain control loop including amplifying and filtering means for providing a control signal to said gain-controlled amplifier, said gain control loop further including first means, referred to hereafter as crowbar means, for providing a maximum gain signal to said gain control amplifier in response to a drop in input signal to said gain-controlled amplifier, and further including second means, hereinafter referred to as fast attack means, for providing a minimum gain control signal to said gain-controlled amplifier in response to a sudden increase in input signal level to said gain-controlled amplifier. In a preferred embodiment, said crowbar means includes means cooperatively functioning with the gain control loop filter means to provide minimum voltage as a control signal to said gain-controlled amplifier. In a preferred embodiment, also, said fast attack means cooperatively functions with said gain control loop filter means to provide a maximum voltage as a control signal to said gain controlled amplifier.

The invention will be more fully understood from the following detailed description and appended claims when taken with the drawings, in which:

Figures 1, 2:
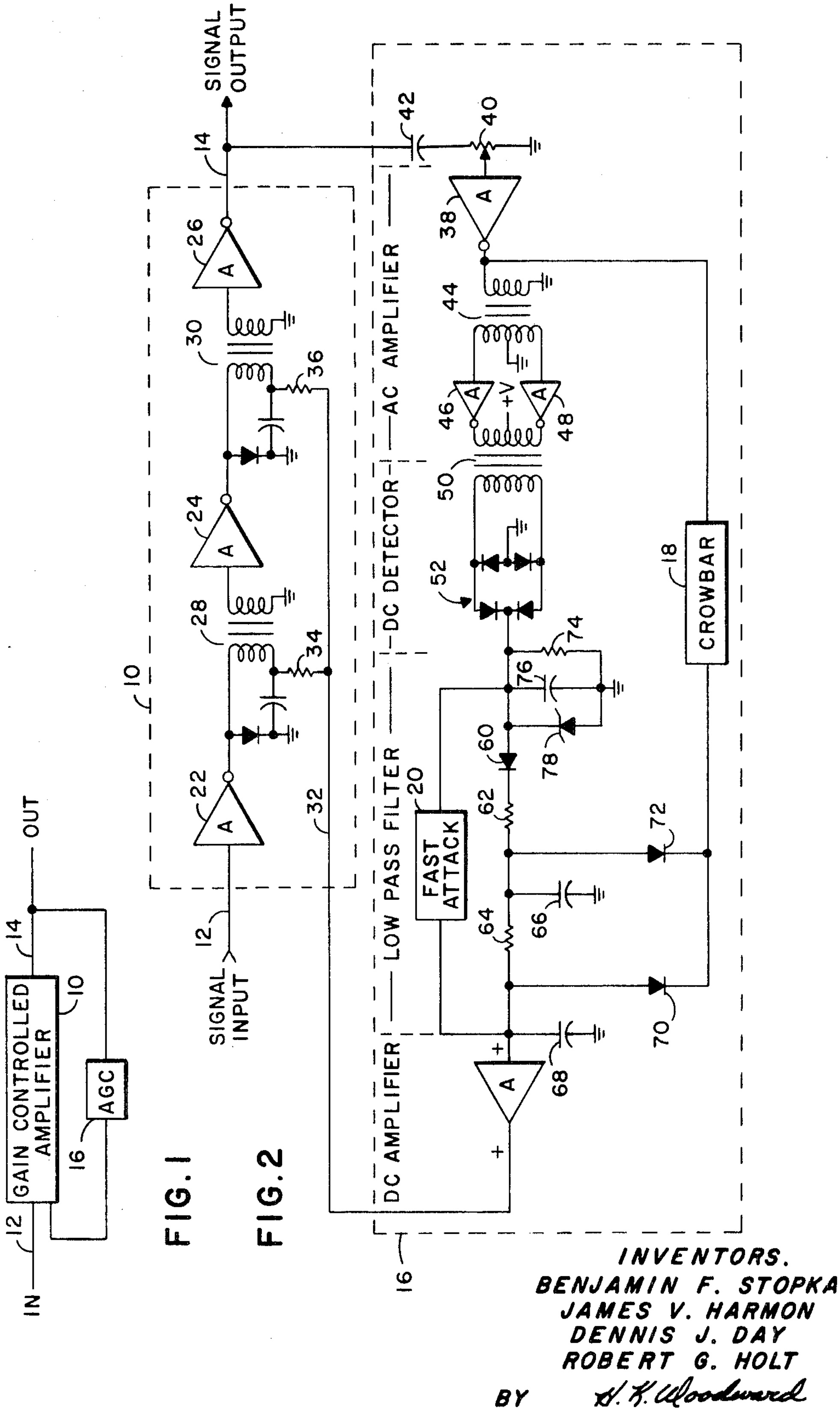
FIG. 1 is a functional block diagram of a gain-controlled amplifier and gain control loop.
FIG. 2 is a schematic of a gain-controlled amplifier and control loop and illustrates by functional block the fast attack means and crowbar means in accordance with the present invention.

Referring now to the drawings, FIG. 1 is a functional block diagram of a gain-controlled amplifier 10 having an input 12, an output 14, and an automatic gain control loop 16 which is connected to receive a control voltage from the output 14 of amplifier 10 and, depending upon the amplitude of the output signal, provide a gain control signal to amplifier 10. Such gain-controlled amplifiers are conventionally employed in radio receivers to effectively receive signals of various levels and to avoid cross modulation and other dilatorious effects in the mixer, IF, and RF stages of the receiver. A limiting factor encountered in gain controlled amplifiers is delay of adjustment of gain when the input signal strength varies from a maximum to a minimum level, and vice versa. As discussed above, this delay is encountered primarily because of filters in the automatic gain control loop which are employed to minimize the adverse effects of harmonic and intermodulation distortion.

FIG. 2 is a schematic of a gain-controlled amplifier and control loop which includes crowbar means for accelerating the increase in amplifier gain as the input signal changes from a high level to a very small level (e.g., 4 volts peak to 10 microvolts RMS). Conversely, fast attack means 20 is provided to rapidly decrease amplifier gain in response to a sudden increase in input signal to said amplifier.

Gain-controlled amplifier 10 in FIG. 2 is a conventional three-stage circuit comprising amplifiers 22, 24, and 26 with coupling transformer 28 interconnecting the first and second stages and coupling transformer 30 interconnecting the second and third stages. Automatic gain control loop 16 comprises an AC amplifier, a DC detector, an RC filter, and a DC amplifier which are serially connected between the output 14 of the gain controlled amplifier 10 and the gain control line 32, as indicated, and which provide the gain control voltage through registers 34 and 36 to the primaries of coupling transformers 28 and 30, respectively.

The AC amplifier portion of the automatic gain control loop 16 includes amplifier 38, the input of which is connected through potentiometer 40 and AC coupling capacitor 42 to the output 14 of gain controlled amplifier 10. The output of amplifier 38 is coupled by means of transformer 44 to a push-pull amplifier comprising amplifiers 46 and 48. The output of the push-pull amplifier is coupled by means of transformer 50 to the DC detector comprising a rectifier bridge shown generally at 52.

The output of the DC detector is then applied through diode 60 to the RC filter means comprising series resistors 62 and 64 and shunt capacitors 66 and 68. Diodes 70 and 72 interconnect the crowbar means 18 to the common terminal of capacitor 68 and resistor 64 and the common terminal of capacitor 66 and resistor 62, respectively. The function of diodes 70 and 72 will be described below with reference to FIG. 3.

Shunting the output of the DC detector to ground is a parallel combination of resistor 74, capacitor 76, and voltage reference diode 78. Because of the fast attack means to be described below with respect to FIG. 4, voltage reference diode 78 may be employed to clip the DC detector output voltage, and this clipping plus the filtering provided by capacitor 76 insures the availability of a clean DC voltage at the output of the detector.

Gain control may be readily accomplished by the described circuitry for relatively small changes in level of input signal to the gain-controlled amplifier 10. As the input signal increases, the feedback control voltage provided by the gain control loop increases and consequently reduces the gain of the gain-controlled amplifier. Conversely, when the input signal decreases, the feedback control voltage decreases and gain of the controlled amplifier is increased.

Consideration is now given to the means for decreasing response time of the gain control loop when the change in input signal is large, such as the sudden application of a signal to the gain-controlled amplifier or a sudden drop in input signal. The crowbar means 18 of FIG. 2 is provided to accelerate the increase of gain of the controlled amplifier in response to a sudden decrease in input signal level, and the fast attack means 20 is provided to decrease the gain of the controlled amplifier 10 in response to the sudden application of a large input signal.

Figure 3:
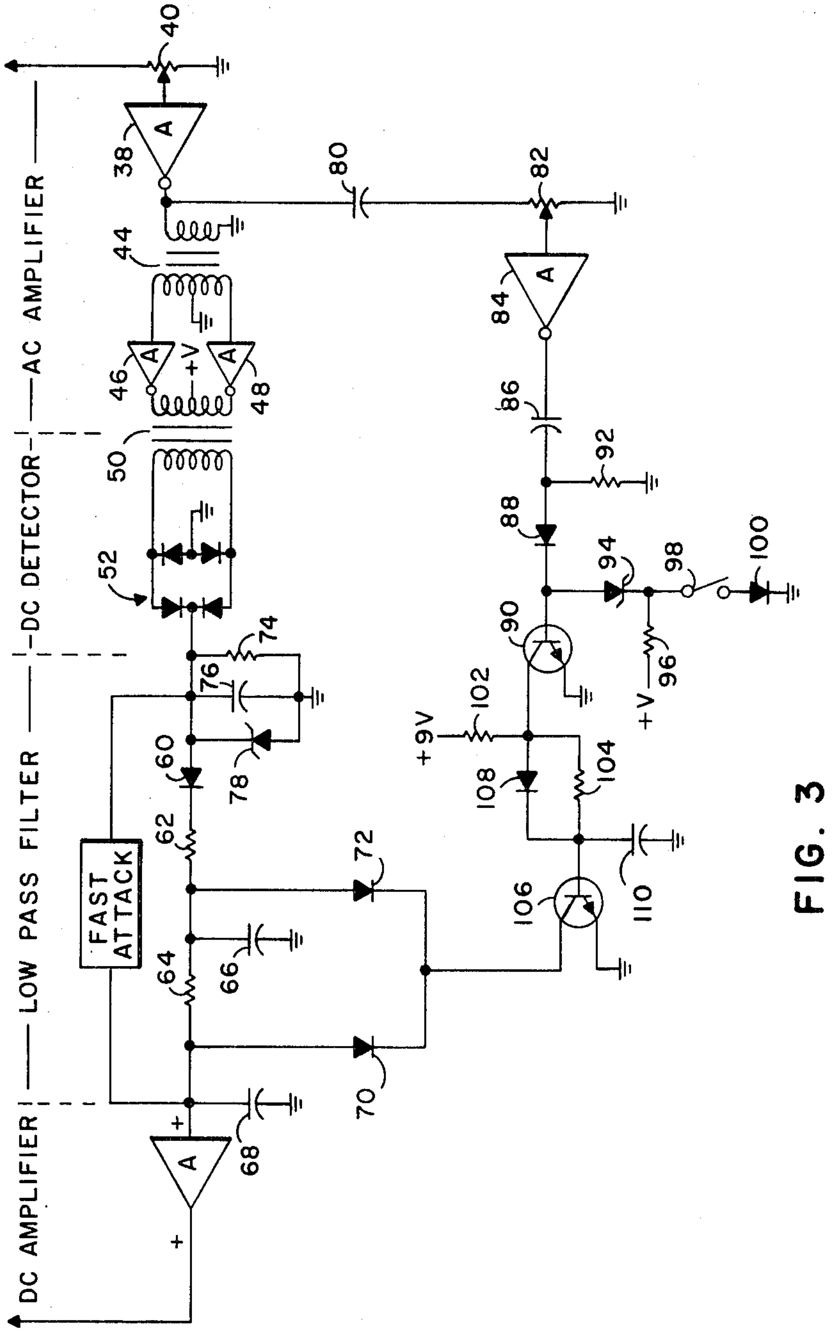
FIG. 3 is a schematic of a portion of FIG. 2 and further includes the schematic of a preferred embodiment of said crowbar means.

Crowbar means 18 will now be described with reference to FIG. 3. A portion of the signal at the output of amplifier 38 is coupled through capacitor 80 and potentiometer 82 to the input of amplifier 84. The output of amplifier 84 is fed through coupling capacitor 86 and diode 88 to the base of transistor 90 in the crowbar means. Steering diode 88 functions to allow only the positive signal swing from amplifier 84 to reach the base of transistor 90. Resistor 92 is connected between the common terminal of capacitor 86 and diode 88 and ground and functions to discharge capacitor 86.

Voltage reference diode 94 and resistor 96 serially connect the base of transistor 90 to a positive voltage potential, +V, and switch 98 and diode 100 serially connect the common terminal of resistor 96 and voltage reference diode 94 to ground. Switch 9— is provided to disable the crowbar means when open. With switch 98 open, the positive voltage supply, +V, is sufficient to break over voltage reference diode 94 and supplies base current to transistor 90 thereby rendering transistor 90 conductive. However, when switch 98 is closed, the crowbar means is enabled and base current for transistor 90 must come from the signal voltage supplied by amplifier 84 through coupling capacitor 86 and diode 88. In this condition, it will be noted that two diode voltage drops are encountered from the base of transistor 90 to ground (across diodes 94 and 100) which is sufficient voltage to render transistor 90 conductive.

Transistor 90 functions as a switch connecting the common terminals of resistors 102 and 104 to ground. Resistors 102 and 104 serially connect a positive supply voltage, +V, to the base of transistor 106. Diode 108 is connected to shunt resistor 104, and capacitor 110 is provided to shunt the base of transistor 106 to ground. Transistor 106 functions as a switch connecting diodes 70 and 72 in the RC filter to ground.

Assume that the crowbar means is enabled by the closing of switch 98, and that there are positive pulses of sufficient amplitude to render transistor 90 conductive. The common terminal of resistors 102 and 104 is then pulled down to ground potential every half period of the output signal of the gain controlled amplifier 10. In a typical IF amplifier, the frequency may be 250 kHz. When gain controlled amplifier 10 is providing an output signal of desired voltage level, the periodic grounding of the junction of transistors 102 and 104 at the IF frequency will prevent charge accumulating on capacitor 110 and thus preventing the conduction of transistor 106. However, should the signal level at the output of gain controlled amplifier 10 drop to a low level because of the decrease in amplifier input signal, the voltage level at the base of transistor 90 falls below the level required to render transistor 90 conductive, and consequently the common terminal of resistors 102 and 104 is not grounded and capacitor 110 is allowed to charge. When the voltage across capacitor 110 reaches sufficient potential, transistor 106 conducts and the capacitors 66 and 68 in the RC filter are discharged through diodes 70 and 72, respectively, to ground. This removal of voltage at the input of the DC amplifier produces a minimum gain control signal to the gain controlled amplifier 10 and the gain thereof consequently increases until the desired signal output level is again attained.

In steady state operation the output level of the gain-controlled amplifier 10 is a fixed value for all steady state input signal levels within a given operating range. However, because of the slow response of the gain control loop, a sudden decrease in the input signal will be seen at the amplifier output. This decrease in amplifier output voltage is reflected through amplifier 38, amplifier 84, and ultimately at capacitor 110. If this reduction in output signal level is of sufficient amplitude and time duration, then capacitor 110 charges to sufficient voltage to render transistor 106 conductive, and the automatic gain control line is crowbarred. The crowbar will remain on until amplifier gain has increased enough to bring the signal level at the base of transistor 90 up to turn-on potential. To speed turnoff delay in the crowbar means, a shunt resistor may be added between the base of transistor 106 and ground to dissipate the charge built up on capacitor 110.

The fast attack means will now be described with reference to FIG. 4. Just as the crowbar means, described above with reference to FIG. 3, functions to speed the increase in gain as an input signal drops to a low level, the fast attack means functions to rapidly decrease gain in response to the sudden application of a large input signal to the gain-controlled amplifier. The primary function of the fast attack means is to provide rapid charging of the capacitors in the RC filter of the gain control loop thereby increasing the input to the DC amplifier and consequently increasing the gain control signal to the gain controlled amplifier. In performing this function, it is imperative that the fast attack means not cause an AGC overshoot by overcharging the shunt capacitors of the RC filter as this may trigger the crowbar means.

Figure 4:
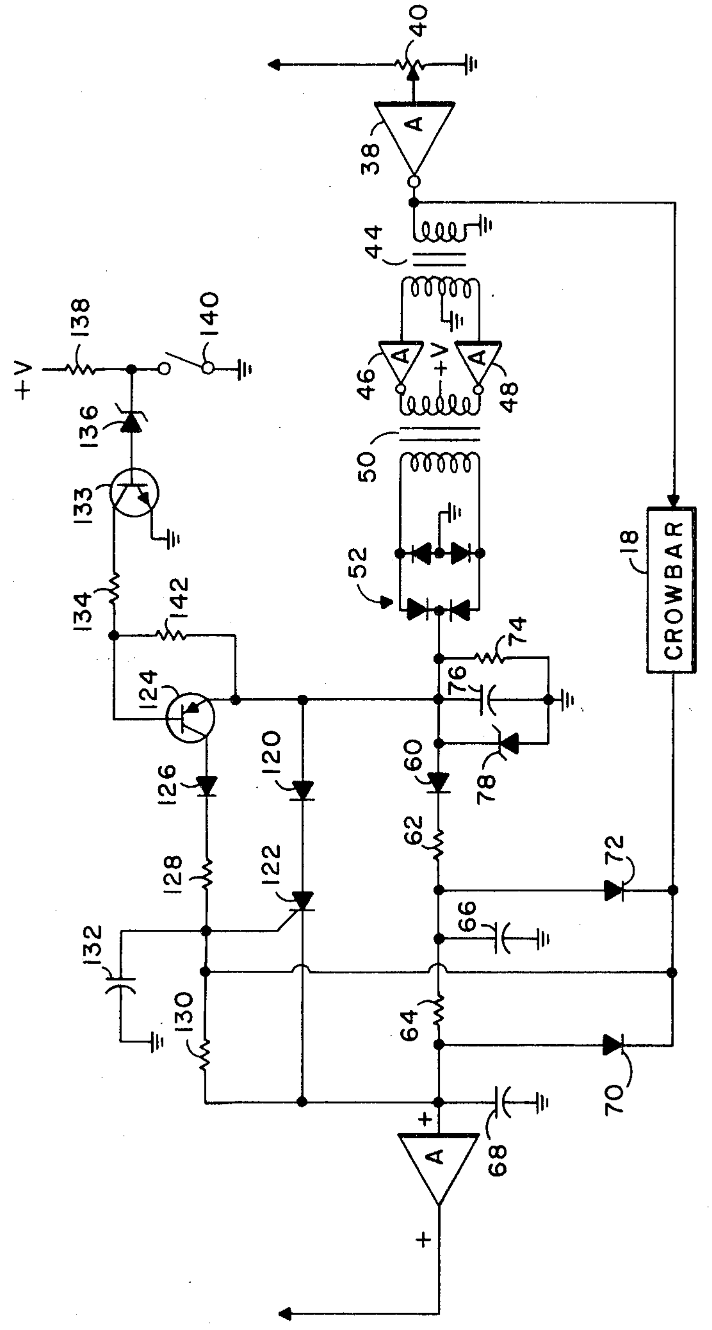
FIG. 4 is a schematic of a portion of FIG. 2 and further includes the schematic of a preferred embodiment of said fast attack means.

In the preferred embodiment illustrated in FIG. 4, the fast attack charging circuit is provided between the output of the DC detector and capacitor 68 at the input of the DC amplifier of the AGC loop by serially connected diode 120 and controlled rectifier 122. The trigger circuit for controlled rectifier 122 includes transistor 124 which is serially connected with diode 126, resistor 128, and resistor 130 between the output of the DC detector and the input of the DC amplifier of the AGC loop. The common terminal of resistors 128 and 130 is connected to the control electrode of controlled rectifier 122 and also through capacitor 132 to ground.

The bias on the base of transistor 124 is provided by resistor 142 connected to the output of the DC detector and by transistor 133 the collector of which is connected through resistor 134 to the base of transistor 124 and the emitter of which is grounded. The base of transistor 133 is connected through voltage reference diode 136 and resistor 138 to a positive voltage source, +V. The common terminal of voltage reference diode 136 and resistor 138 is connected through switch means 140 to ground. The closing of switch 140 prevents the conduction of transistor 124 and thus disables the fast attack means. Consider now switch 140 being open and the fast attack circuit enabled. Transistor 133 is biased to conduct and, assuming desired output voltage by the gain-controlled amplifier, the bias on the base of transistor 124 is insufficient to render transistor 124 conductive. Accordingly, no trigger voltage is supplied to controlled rectifier 122 and it also remains nonconductive. Assume now that a surge in output signal from the gain-controlled amplifier is produced by a surge in input signal and this surge in signal is present at the output of the DC detector of the ACG loop. Resistor 142, connected between the output of the DC detector and the base electrode of transistor 124, forms a voltage divider circuit with resistor 134 of appropriate value such that transistor 124 is turned on and saturated any time the DC voltage at the output of the DC detector surges and exceeds a predetermined level (e.g., 1 volt). The surge in output voltage present at the output of the DC detector then forward biases the emitter-base junction of transistor 124 thus turning on and saturating transistor 124. The stored charge in capacitor 76 at the output of the DC detector is transmitted through transistor 124, diode 126 and resistor 128 to charge capacitor 132, and when capacitor 132 reaches a level approximately 0.6 volts greater than the controlled rectifier 122 cathode voltage, controlled rectifier 122 is triggered to the conductive state. The DC detector output signal current is then shunted through diode 120 and controlled rectifier 122 into capacitors 66 and 68 of the RF filter. As these capacitors are charged, the gain of the gain-controlled amplifier decreases until the signal output level reaches the nominal steady state level. Concurrently, the signal through the AGC loop decreases and the output voltage of the DC detector consequently decreases. When the difference in voltage between the DC detector output and the input to the DC amplifier drops below a level of about 1.3 volts, insufficient current flows through controlled rectifier 122 to maintain the conductive state and consequently controlled rectifier 122 becomes nonconductive. The intrinsic standoff voltage of a controlled rectifier is approximately 0.7 volt DC and conduction cannot occur unless the voltage drop across the device remains above this level. Thus, with a 0.6 volt DC drop across diode 120, it is appreciated that controlled rectifier 122 ceases conduction when the total drop across diode 120 and controlled rectifier 122 is about 1.3 volts DC. It should be noted that the inclusion of diode 120 may or may not be necessary in the circuit depending upon the particular application.

In order to trigger the controlled rectifier 122, the increase in voltage at the DC detector output must exceed the voltage at the cathode of controlled rectifier 122 by approximately 1.2 volts DC. This is a function of the gate cathode threshold requirement and also the voltage drop across diode 120 which is in series with controlled rectifier 122. The aforementioned voltage increase may be adjusted by adding or deleting diodes in series with controlled rectifier 122 and/or resistor 128. In a steady state condition, transistor 124 is normally nonconducting and resistor 130, connected between the gate and cathode of controlled rectifier 122 maintains these two electrodes at the same potential.

The parallel combination of resistor 74, capacitor 76, and controlled rectifier 78, which shunt the output of a DC detector to ground, cooperatively function to smooth the DC voltage at the output of the DC detector. Further, the stored energy in capacitor 76 aids in charging capacitor 132 to sufficient potential to trigger controlled rectifier 122. When the controlled rectifier 122 is triggered, the energy of capacitor 76, along with the output of DC detector, is supplied through the controlled rectifier 122 to capacitors 66 and 68. Controlled rectifier 78 may be used to clip the DC detector output voltage at a desired level and the storage capacity of capacitor 76 may be varied as required. It will be appreciated that either adjustment affects the rise time of the voltage across capacitors 66 and 68 when the fast attack means is initiated.

It will be noted that the common terminal of capacitor 132 and resistor 130 is connected to the crowbar means 18. This connection is provided to insure that capacitor 132 is discharged when the crowbar means is actuated. Thus, a new input signal to the gain controlled amplifier, which may arrive shortly after the loss of the original signal, will not find a prebiased gate-cathode circuit for controlled rectifier 122.

The described crowbar and fast attack means have proved very versatile. Either means may be disabled by the opening of switch 98 or the closing of switch 140, as described above. In a specific embodiment of the described circuitry, designed to receive a 10-hard-microvolts RMS signal within 10 milliseconds after the removal of a 4-hard-volts PEV signal (crowbar action) and a fast attack time of 13 milliseconds for a change from no input signal or an input signal of 10-hard microvolts RMS to 0.52 hard-volts RMS, the following component values were employed:

| | | | |
|---|---|---|---|
| 34 | 470. Ω | 92 | 2.2 kΩ |
| 36 | 470. Ω | 94 | 1N747A |
| 40 | 1 kΩ | 96 | 2.2 kΩ |
| 42 | 1. μf. | 100 | 1N569 |
| 52 | 1N3064 | 102 | 9.09 kΩ |
| 60 | 1N569 | 104 | 470. Ω |
| 62 | 8.2 kΩ | 106 | 2N956 |
| 64 | 12.1 Ω | 108 | 1N569 |
| 66 | 47. μf. | 110 | 10. μf. |
| 68 | 47. μf. | 120 | 1N3064 |
| 70 | 1N569 | 122 | CB1028 |
| 72 | 1N569 | 124 | 2N2907 |
| 74 | 2.87 kΩ | 126 | 1N3064 |
| 76 | 3.3 μf. | 128 | 3.01 kΩ |
| 78 | 1N747A | 130 | 10. kΩ |
| 80 | 1,000 pf. | 132 | 2.2 μf. |
| 82 | 1. kΩ | 133 | 2N956 |
| 86 | 1. μf. | 134 | 15. kΩ |
| 88 | 1N569 | 136 | 1N747A |
| 90 | 2N956 | 138 | 22. kΩ |
| | | 142 | 5.6 kΩ |

While the invention has been described with reference to a specific embodiment, the description is illustrative and should not be construed as limiting the scope of the invention. Various modifications and changes may be made by those skilled in the art without departing from the spirit and scope of the invention.

We claim:

1. In a radio receiver, an amplifier stage comprising gain-controlled amplification means having an input and an output, gain control means operatively connected to said output and producing a gain control voltage as a function of a signal at said output and providing said gain control voltage to said gain-controlled amplification means, said gain control means including first means responsive to a decrease in signal at said output of a predetermined amount for accelerating the production of a gain control voltage to increase the gain of said gain-controlled amplification means, said gain control means further including second means responsive to an increase in signal at said output of a predetermined amount for accelerating the production of a gain control voltage to decrease the gain of said gain-controlled amplification means, said first and second means are normally inactive and are actuated by a decrease in signal of a predetermined amount or an increase in signal of a predetermined amount, respectively, said gain control means including low-pass filter means including shunt capacitive means, amplification means from receiving and amplifying a portion of said signal at said output, and DC detector means operatively connected to receive the output signal of said amplification means and provide a detected DC voltage to said low-pass filter means, said gain control voltage being generated by electrical charge on said shunt capacitive means, said first means including diode means and first transistor switch means serially connected between said shunt capacitive means and circuit ground for providing a discharge path for said shunt capacitive means, the control bias of said first transistor switch means being controlled by a second transistor switch means which is biased by voltage reference means whereby said second transistor switch means is rendered nonconductive by a decrease in signal, at said output and thereby renders said first transistor switch means conductive.

2. In a radio receiver, an amplifier stage as defined by claim 1 wherein said second means includes controlled rectifier means connected between the output of said DC detector means and said shunt capacitive means, and trigger circuit means operatively connected to the output of said DC detector means for triggering said controlled rectifier means in response to an increase in signal at said output of a predetermined amount thereby providing a charging circuit for said shunt capacitive means.

3. In a radio receiver, an amplifier stage as defined by claim 2 wherein said controlled rectifier means includes a controlled rectifier and at least one serially connected diode.

4. A gain-controlled amplifier having an input and an output, gain control means operatively connected to said output and producing a gain control voltage as a function of a signal at said output and providing said gain control voltage to said gain-controlled amplifier, said gain control means including a low-pass filter means including shunt capacitive means, said gain control voltage being generated by electrical charge on said shunt capacitive means, said gain control means further including means responsive to a decrease in signal at said output of a predetermined amount for accelerating the production of a gain control voltage to increase the gain of said gain-controlled amplifier, amplification means from receiving and amplifying a portion of said signal at said output, and DC detector means operatively connected to receive the output signal of said amplification means and provide a detected DC voltage to said low-pass filter means, said means responsive to a decrease in signal including diode means and first transistor switch means serially connected between said shunt capacitive means and circuit ground for providing a discharge path for said shunt capacitive means, the control bias of said first transistor switch means being controlled by a second transistor switch means which is biased by voltage reference means whereby said second transistor switch means is rendered nonconductive by a decrease in signal at said output and thereby renders said first transistor switch means conductive.

5. A gain-controlled amplifier having an input and an output, gain control means operatively connected to said output and producing a gain control voltage as a function of a signal at said output and providing said gain control voltage to said gain-controlled amplifier, said gain control means including a low-pass filter means including shunt capacitive means, said gain control voltage being generated by electrical charge on said shunt capacitive means, said gain control means further including means responsive to an increase in signal at said output of a predetermined amount for accelerating the production of a gain control voltage amplifier, amplification means from receiving and amplifying a portion of said signal at said output, and DC detector means operatively connected to receive the output signal of said amplification means and provide a detected DC voltage to said low-pass filter means, said means responsive to an increase in signal including controlled rectifier means connected between the output of said DC detector means and said shunt capacitive means, and trigger circuit means operatively connected to the output of said DC detector means for triggering said controlled rectifier means in response to an increase in signal at said output of a predetermined amount thereby providing a charging circuit for said shunt capacitive means.

6. A gain-controlled amplifier as defined by claim 5 wherein said controlled rectifier means includes a controlled rectifier and at least one serially connected diode.

* * * * *